United States Patent
Tsironis

(10) Patent No.: US 10,693,208 B1
(45) Date of Patent: Jun. 23, 2020

(54) HIGH GAMMA DISC-TUNING PROBES FOR IMPEDANCE TUNERS

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 16/254,942

(22) Filed: Jan. 23, 2019

Related U.S. Application Data

(60) Provisional application No. 62/621,634, filed on Jan. 25, 2018.

(51) Int. Cl.
  *H03H 7/38* (2006.01)
  *H01P 5/04* (2006.01)
  *G01R 27/04* (2006.01)
  *H01P 3/02* (2006.01)

(52) U.S. Cl.
  CPC ............... *H01P 5/04* (2013.01); *G01R 27/04* (2013.01); *H01P 3/023* (2013.01); *H03H 7/38* (2013.01)

(58) Field of Classification Search
  CPC .............. H03H 7/38; H03H 7/40; H01P 1/18
  USPC ................................... 333/17.3, 32, 33, 263
  See application file for complete search history.

(56) References Cited

U.S. PATENT DOCUMENTS

| | | |
|---|---|---|
| 6,980,064 B1 | 12/2005 | Boulerne |
| 6,998,836 B2 | 2/2006 | Tsironis |
| 9,276,551 B1 | 3/2016 | Tsironis |
| 9,257,963 B1 | 7/2016 | Tsironis |
| 9,602,072 B1 | 3/2017 | Tsironis |
| 9,625,556 B1 | 4/2017 | Tsironis |
| RE46,703 E | 2/2018 | Tsironis |

OTHER PUBLICATIONS

Load Pull [online], Wikipedia [retrieved on Nov. 18, 2016], Retrieved from Internet <URL:https://en.wikipedia.org/wiki/Load_pull>.
"Computer Controlled Microwave Tuner—CCMT", Product Note 41, Focus Microwaves, Jan. 1998.

*Primary Examiner* — Stephen E. Jones

(57) ABSTRACT

High GAMMA disc-shaped tuning probes for high frequency electro-mechanical slide screw impedance tuners use a notch slug concept, whereby the head of the tuning probes is split in two distinct lobes in a static pre-matching configuration. The disc-probes rotate around an axis perpendicular to the axis of the slotted airline of the tuner and do not require a cumbersome vertical axis. The rotation moves the tuning lobes gradually into the slot of the airline and controls the amplitude of the reflection factor through increasing coupling. The disc-probes comprise two diametrical opposite tuning lob assemblies designed to create high reflection (GAMMA) at two distinct frequency bands, one for high end frequencies and one for low end frequencies.

6 Claims, 16 Drawing Sheets

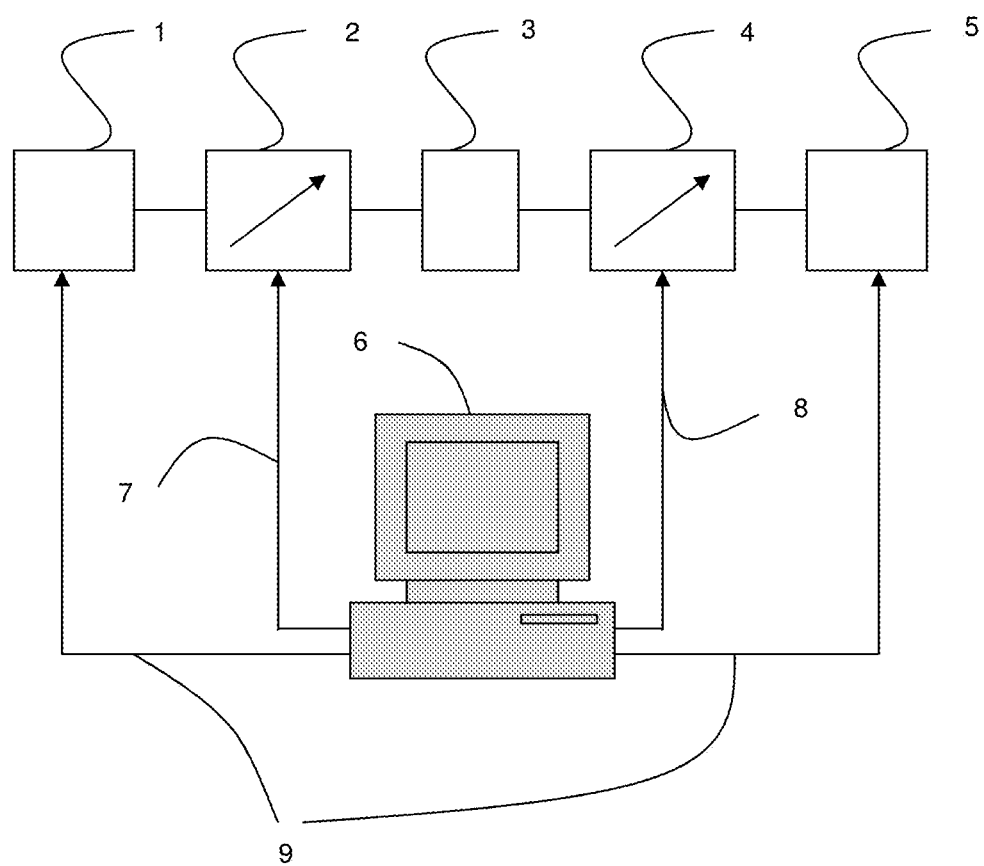
FIG. 1: Prior art

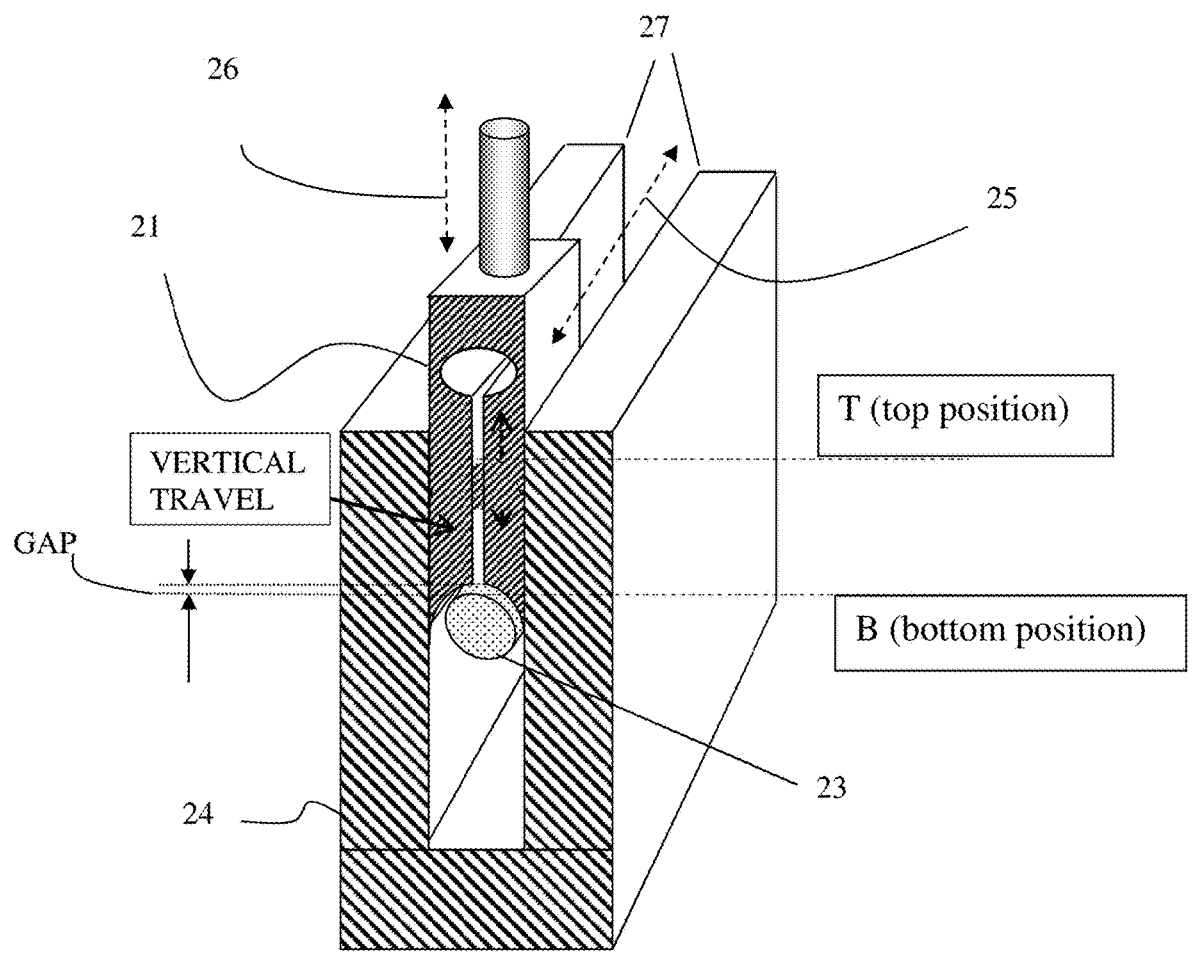
FIG. 2: Prior art

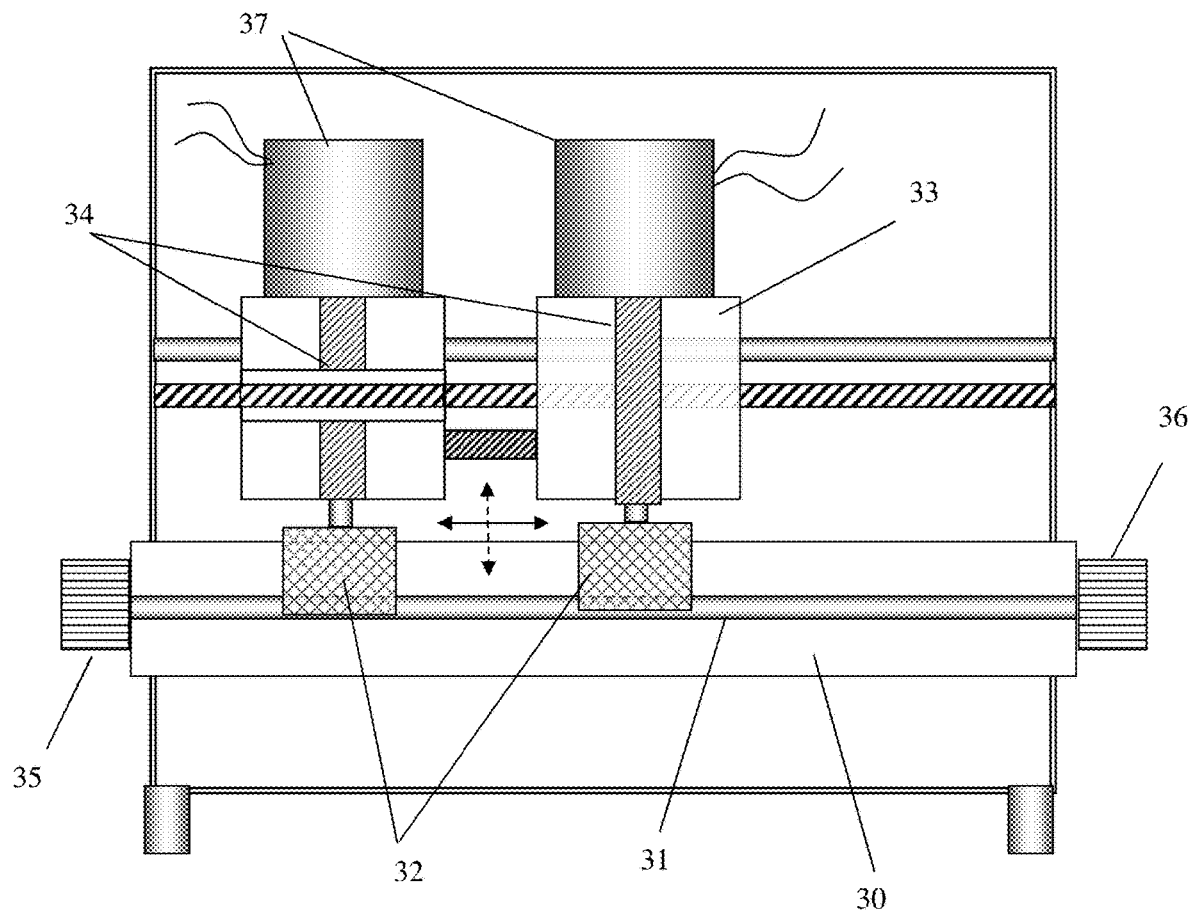
FIG. 3: Prior art

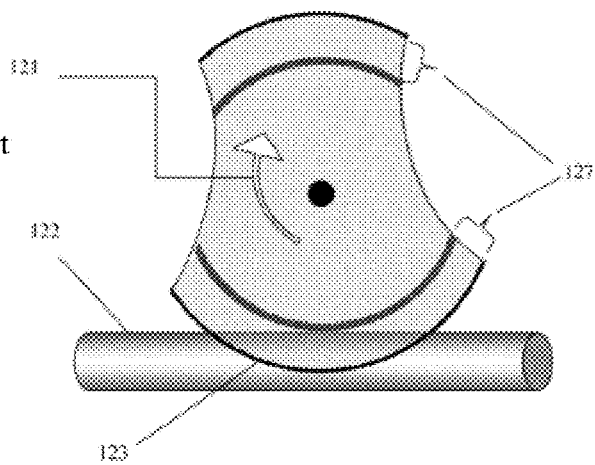
FIG. 5A: Prior art
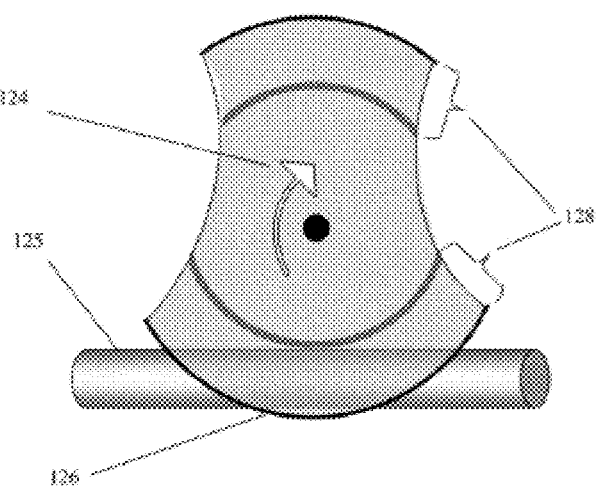
FIG. 5B: Prior art

FIG. 6A: Prior art
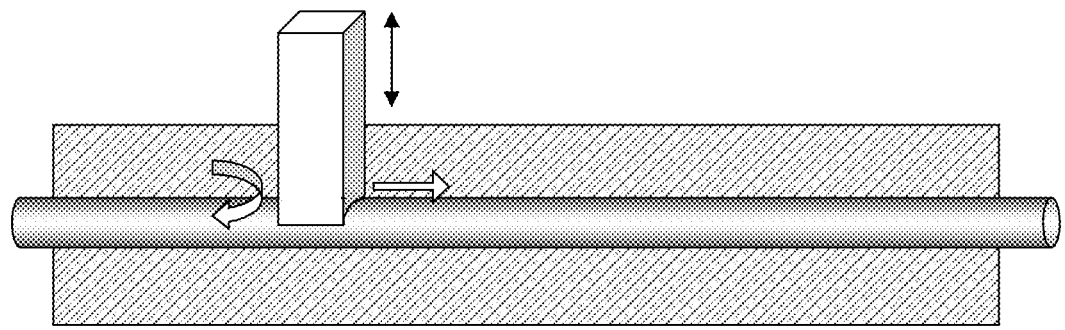
FIG. 6B: Prior art
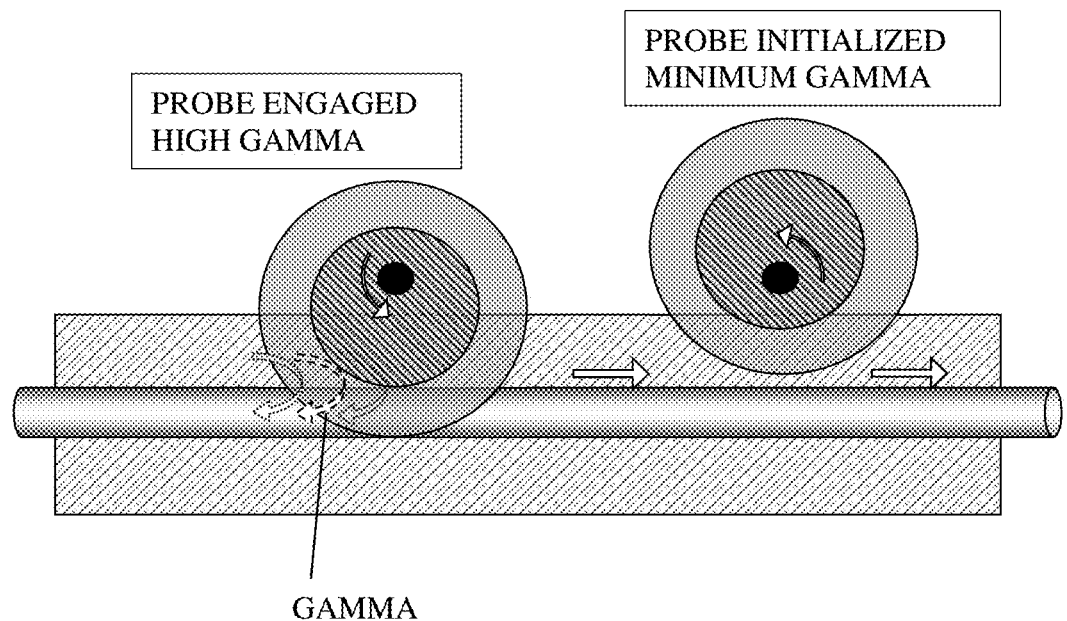
GAMMA

FIG. 7A
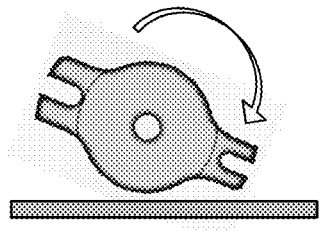 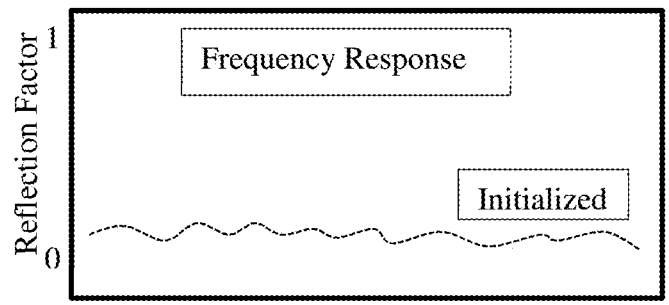
FIG. 7B
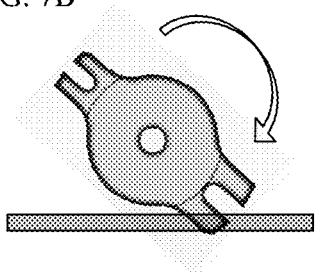 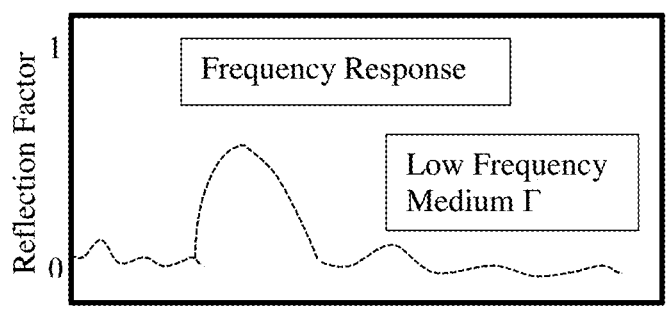
FIG. 7C
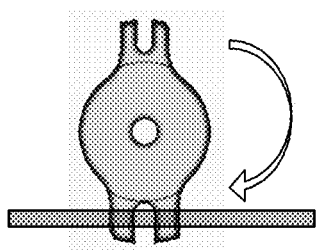 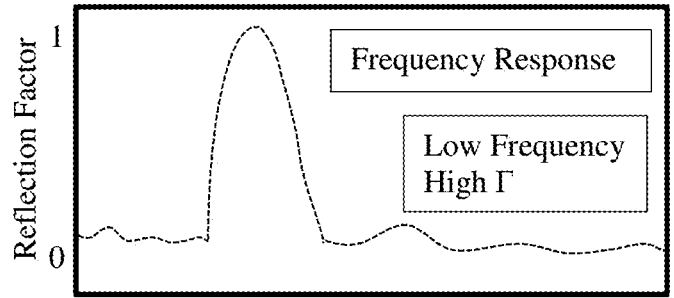
FIG. 7D
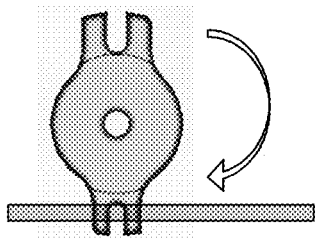 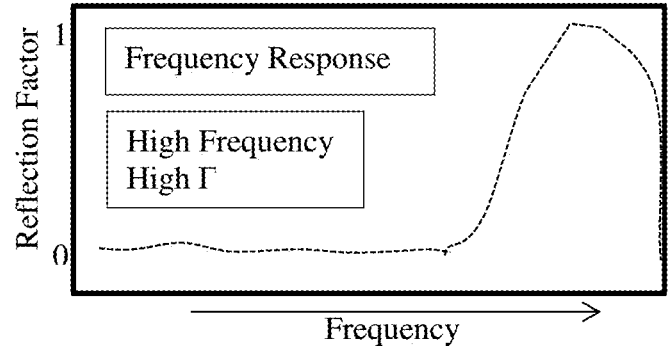

FIG. 14: Prior art

HIGH GAMMA DISC-TUNING PROBES FOR IMPEDANCE TUNERS

PRIORITY CLAIM

This application claims priority on provisional application 62/621,634, filed on Jan. 25, 2018, titled "HIGH GAMMA DISC-TUNING PROBES FOR IMPEDANCE TUNERS".

CROSS-REFERENCE TO RELATED ARTICLES

1. "Load Pull", [online], Wikipedia [Retrieved on Nov. 18, 2016] Retrieved from Internet <URL: http://en.wikipedia.org/wiki/Load_pull>.
2. "Computer Controlled Microwave Tuner—CCMT", Product Note 41, Focus Microwaves January 1998
3. Boulerne P., U.S. Pat. No. 6,980,064, "Slide-Screw Tuner with Single corrugated Slug".
4. Tsironis C., U.S. Pat. No. RE46,703, "High frequency, high reflection pre-matching tuners with variable zero initialization".
5. Tsironis C., U.S. Pat. No. 9,276,551, "Impedance Tuner with Rotating Multi-Section Probes".
6. Tsironis C., U.S. Pat. No. 9,602,072, "Compact Two Probe Impedance Tuner"
7. Tsironis C., U.S. Pat. No. 9,257,963, "Impedance Tuners with Rotating Probes"
8. Tsironis C., U.S. Pat. No. 9,625,556, "Method for Calibration and Tuning with Impedance Tuners".
9. Tsironis C.: U.S. Pat. No. 6,998,836, "Low loss integration of wafer probes with microwave tuners", column 1, lines 51-62.

BACKGROUND OF THE INVENTION

This invention relates to RF load and source pull testing of low noise as well as medium and high-power RF transistors and amplifiers.

Modern design of low noise or high-power RF amplifiers and mixers, used in various communication systems, requires accurate knowledge of the active device's (microwave transistor's) characteristics. In such circuits, it is insufficient for the transistors, which operate either as very low noise or as highly non-linear devices, close to power saturation, to be described using linear or non-linear numeric models. A popular method for testing and characterizing such microwave components (transistors) in the non-linear region of operation is "load pull" or "source pull" (see ref. 1). Load/source pull is a measurement technique employing microwave impedance tuners 2, 4 and other microwave test equipment (FIG. 1), such as signal source 1, source (input) 2 and load (output) 4 tuner, input and output 5 power meter and test fixture 3 which holds the DUT. The tuners and equipment are controlled by a computer 6 via digital cables 7, 8, 9. The microwave impedance tuners are devices which allow manipulating the RF impedance presented to the Device Under Test (DUT, or transistor) to test (see ref. 2); this document refers hence to "impedance tuners", in order to make a clear distinction to "tuned receivers (radios)", popularly called elsewhere also "tuners" because of the included tuning circuits.

Electro-mechanical impedance tuners (FIGS. 2 and 3) in the microwave and low millimeter-wave frequency range between 100 MHz and 70 GHz are using the slide-screw concept and include a slabline 24, 30 with a test port 35 and an idle port 36, a center conductor 23, 31 and two mobile carriages 33 which carry vertical motors 37 and vertical axes 34, which control simultaneously the vertical position of reflective probes 32, see ref. 4. The carriages are moved horizontally by additional motors (not shown) and gear. The signal enters into one port 35 and exits from the other 36. In load pull, the test port is the one where the signal enters, in source pull the test port is the one where the signal exits. The entire mechanism is, typically, integrated in a solid housing, since mechanical precision is of highest importance. Millimeter-waves occupy the frequency spectrum from approximately 30 GHz to 300 GHz. The wavelength ($\lambda$) is in the 10 mm to 1 mm range. The tuners in the present embodiment operate from 20 to 70 GHz, corresponding to wavelengths between 15 and 4.6 mm, though the concept of multiple slug tuning probes has been demonstrated for frequencies as low as 1 GHz. The only structural limitation is the required horizontal travel of the tuning probe. A slide screw tuner must allow horizontal travel of one half of a wavelength ($\lambda/2$), or, in the case of Fmin=20 GHz, at least 7.5 mm, in order to allow for a 360° rotation of the created reflection factor (the reflection phase is double the transmission phase). The required free horizontal travel is inverse proportional to the minimum frequency of operation (at 10 GHz it is 15 mm at 1 GHz it is 150 mm, etc..)

The typical configuration of the reflective probe inside the slabline is shown in FIG. 2: a number of parallel reflective tuning elements 21 also called "tuning" probes or slugs, are inserted into the slotted transmission airline (slabline) 24 and coupled capacitively with the center conductor 23 to an adjustable degree, ranging from very weak (when the probe is withdrawn-Top position) to very strong (when the probe is very close (within electric discharge—or Corona) to the center conductor (Bottom position); it must be pointed that capacitive "tuning" probes are different from "sampling" probes, which are loosely coupled with the center conductor; when the tuning probes move vertically 26 between the "top position" and the "bottom position", approach the center conductor 23 of the slabline 24 and are moved along the axis 25 of the slabline, they alter the amplitude and phase of the reflection factors seen at the slabline ports, covering parts or the totality of the Smith chart (the normalized reflection factor area). The relation between reflection factor and impedance is given by GAMMA=|GAMMA|*exp(j$\Phi$)=(Z−Zo)/(Z+Zo), where Z is the complex impedance Z=R+jX and Zo is the characteristic impedance. A typical value used for Zo is 50$\Omega$ (Ohm) (see ref. 3). In a 50$\Omega$ test system (i.e. when the tuner is terminated at both ports with 50$\Omega$), GAMMA is equal to the first element of the tuner two-port s-parameter matrix: GAMMA=S11, also expressed as Standing Wave Voltage Ratio VSWR, whereby VSWR=(1+|GAMMA|)/(1−|GAMMA|).

Up to now such metallic tuning probes (slugs) (FIG. 2) have been made in a cubical form 21 and FIG. 6A with a concave bottom, which allows capturing, when approaching the center conductor 23, the electric field on the sides, between the center conductor and the slabline walls, because the electric field is concentrated in the narrowest space between the center conductor and the ground planes of the slabline. This field capturing allows creating high and controllable reflection factors. Disc formed rotating probes (see ref. 5 and ref. 7) are circular and rotate eccentrically, or can be oval, or elliptical and rotate centered or eccentrically. The distinct beneficial feature of rotating disc-probes is that the coupling factor (or the penetration of the disc body into the slabline) is controllable through the angle of rotation only. This eliminates the need for cumbersome vertical axis structures and a shared slabline configuration (see ref. 6) for reduced tuner length.

The RF transmission media between the reference plane of the tuning probe of the tuner and the tip of the wafer probe, introduce, especially at millimeter-wave frequencies, considerable insertion loss (see ref. 9), which reduces the tuning range of the tuner and by consequence the capacity of the tuner to conjugate-match many high-power/low-impedance transistors. It is therefore of primary importance to increase the tuning range of the tuners. Using two or more probes in a pre-matching scheme allows higher reflection factor (see ref. 3 and ref. 4). The herein newly disclosed "notched" rotating disc tuning probes allow doing this efficiently.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical automated transistor load-pull test system.

FIG. 2 depicts prior art, a perspective view of cubic RF probe (slug) inside a slotted airline (slabline) approaching the center conductor, and the relevant dimensions and parameters of the operation.

FIG. 3 depicts prior art, a front view of an automated pre-matching slide screw impedance tuner using two independent tuning probes (see ref. 4).

FIG. 4A depicts double notch tuning probe; FIG. 4B depicts triple notch tuning probe; FIG. 4C depicts quadruple notch tuning probe.

FIG. 5A through 5B depict prior art: FIG. 5A depicts disc-formed rotating probe covering low frequency band and FIG. 5B depicts disc-formed rotating probe covering high frequency band (see ref. 5).

FIG. 6A through 6B depict prior art: FIG. 6A depicts a cubical tuning probe;

FIG. 6B depicts an eccentrically rotating tuning probe and the tuning mechanism.

FIG. 7A through 7D depict tuning states of dual frequency band notched disc-probe having low frequency and high frequency segments: FIG. 7A depicts initialized (withdrawn) probe; FIG. 7B depicts medium coupling (medium reflection) of the low frequency segment of the notched disc-probe; FIG. 7C depicts high coupling (high reflection) of the low frequency segment of the notched disc-probe; FIG. 7D depicts high coupling (high reflection) of the high frequency segment of the notched disc-probe.

FIG. 11A depicts front view; FIG. 11B depicts cross section and chamfering the top ends of the slabline walls to allow the rotating probe to engage into the slot smoothly.

DETAILED DESCRIPTION OF THE INVENTION

Figure 4A:
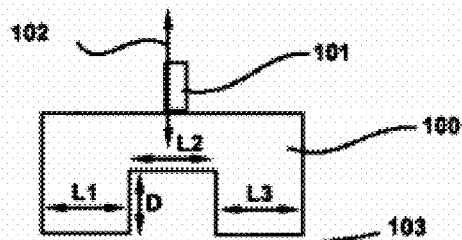
FIG. 4A through 4C depict prior art, the concept of cubical notched tuning probes (see ref. 3).
Figure 4B:
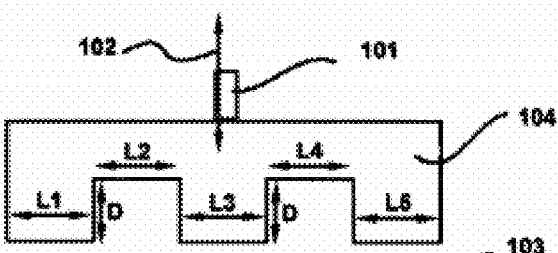
Figure 4C:
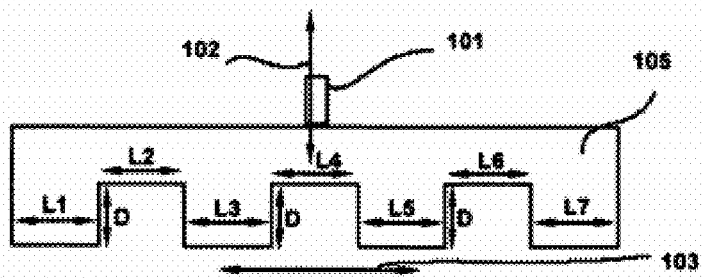
Figure 8:
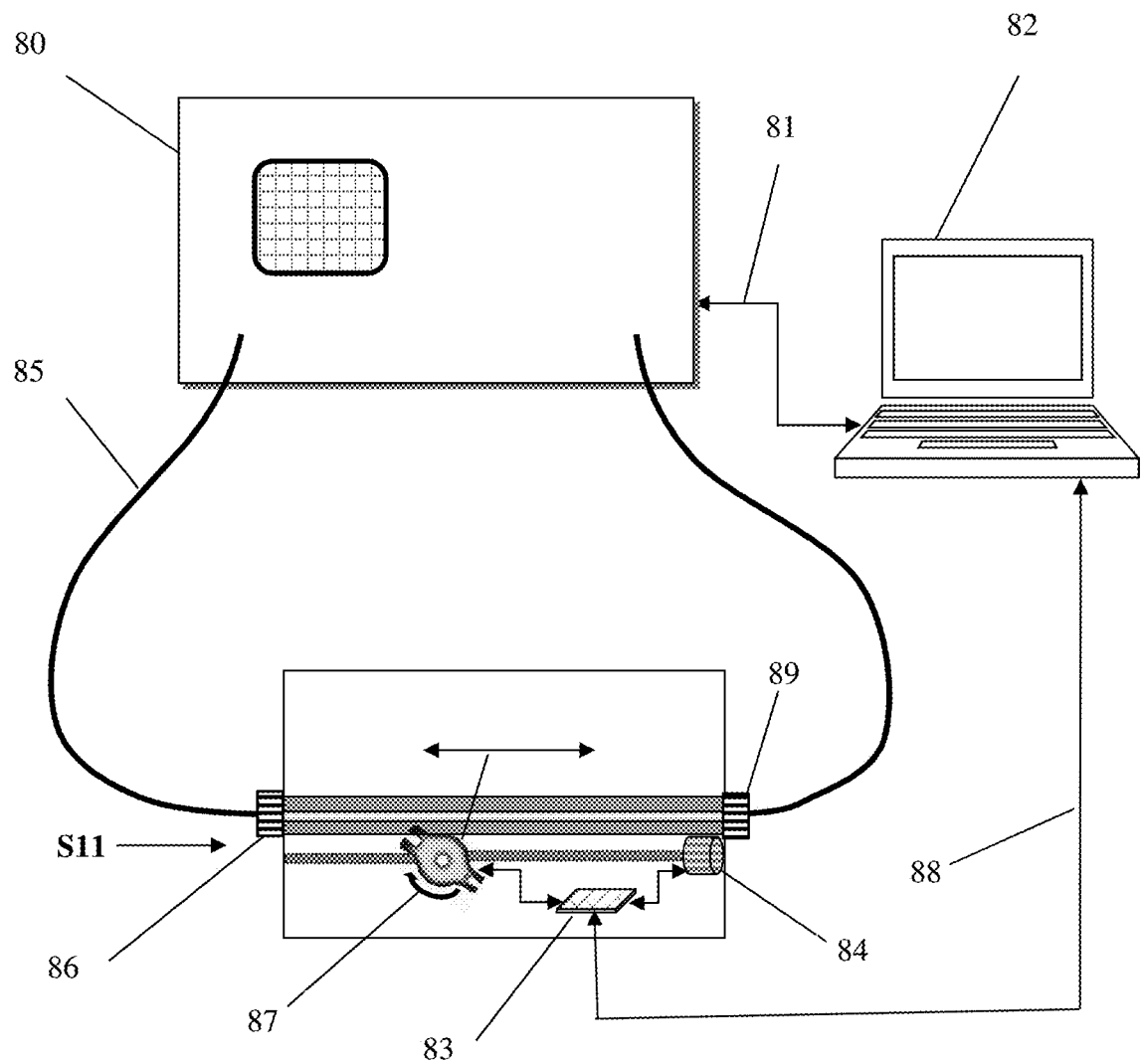
FIG. 8 depicts calibration setup on pre-calibrated VNA for tuner using of dual frequency band notched probe.

This invention discloses a new concept of high GAMMA rotating disc-formed tuning probes for RF and millimeter-wave tuners. Other than any prior art, the new probes combine the static pre-matching notched structure with the rotating probe concept. The concept of oblong notched tuning probes has been disclosed before (see ref. 3, FIG. 4A). However, experimental evidence shows that more than two branches (lobes) of the notched probe in FIG. 4, (FIGS. 4B and 4C in prior art ref. 3) have negligible effect on tuning range. Only two lobes (FIG. 4A in ref. 3 and FIG. 9 in this application) matter. Also, no indication or proof of higher tuning range is provided in ref. 3. Notched slugs in ref. 3 are no more than an imaginative static version of pre-matching tuners (FIG. 3 and ref. 4). In this invention (FIG. 13) actual measured data prove the validity of the concept and the natural trade-off in notched probes: i.e. reduced bandwidth for higher tuning range.

Figure 11A:
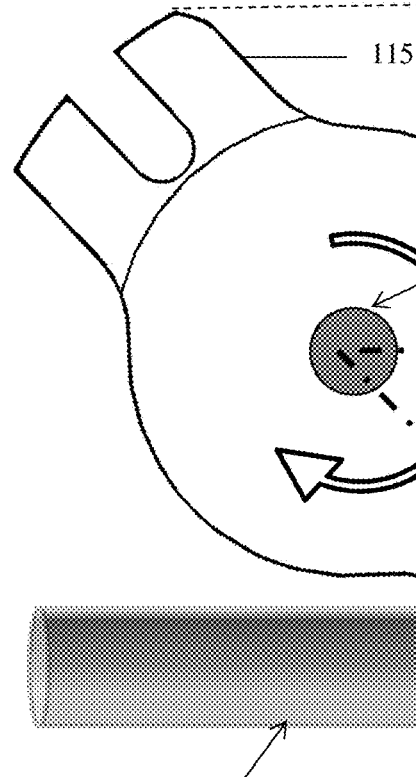
FIG. 11A through 11B depict low coupling (reflection) of high frequency segment of dual frequency band notched disc-probe.
Figure 14:
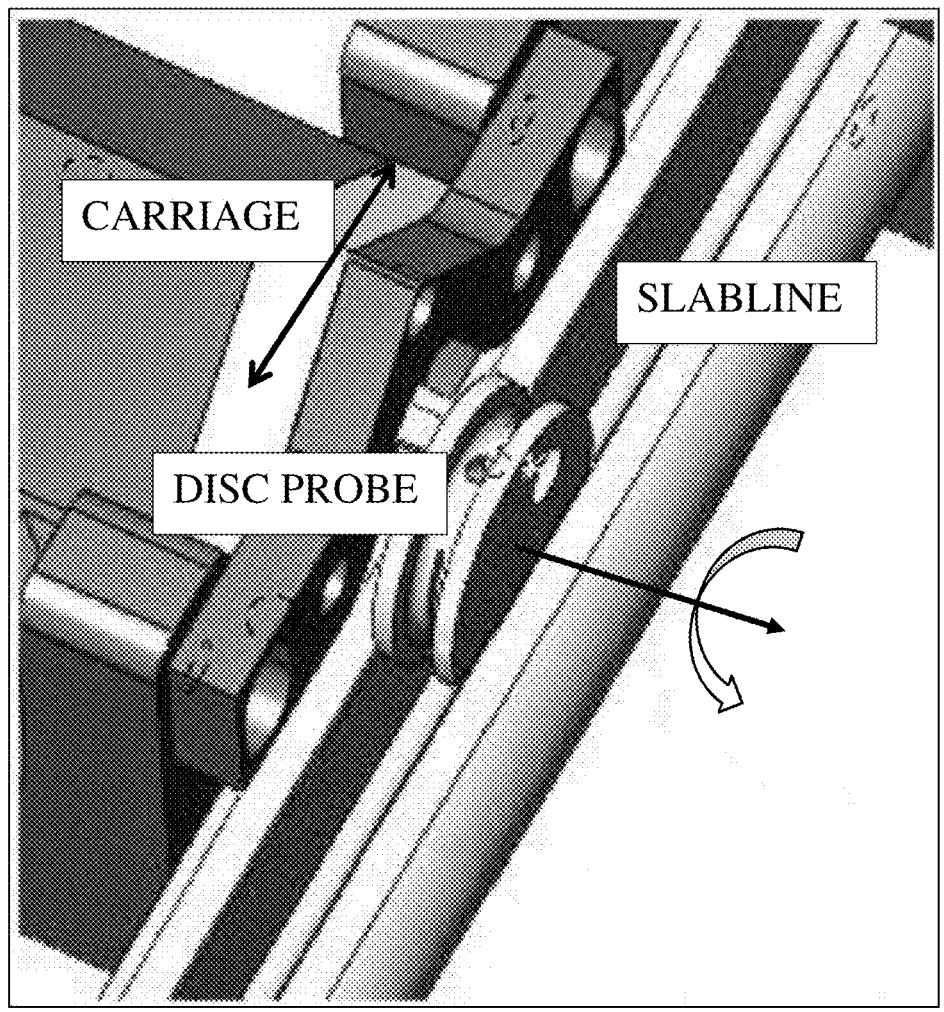
FIG. 14 depicts prior art: Perspective view of dual frequency band disc-probe rotating inside a slotted airline (slabline) and horizontally controlling carriage.
Figure 16:
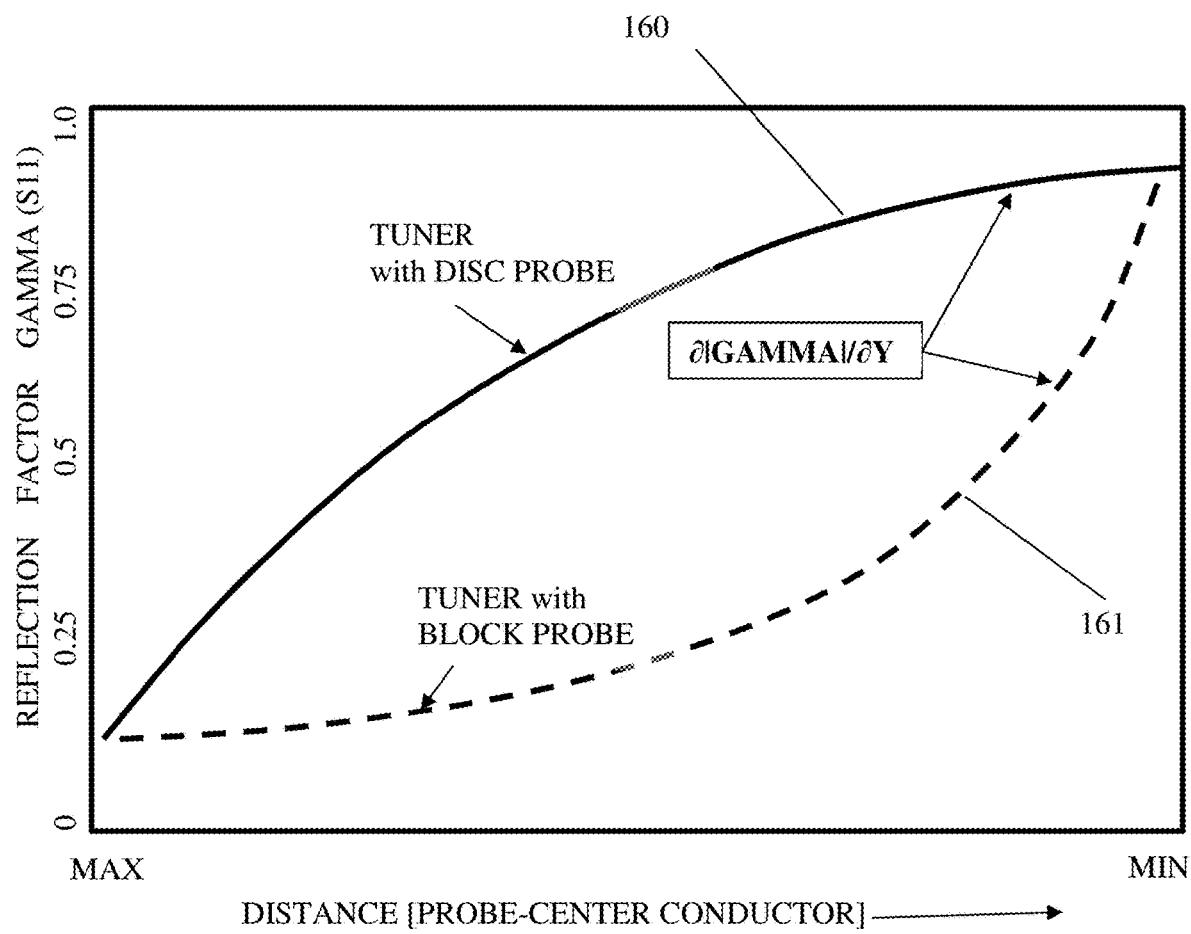
FIG. 16 depicts tuning sensitivity as a function of vertical probe control of block tuning probes versus rotating disc probes.

Using disc-probes simplifies the tuner mechanics (FIG. 14) and shrinks the tuner profile, which is important for on-wafer test setups, because there is no need for cumbersome high precision vertical axes 34; rotating the disc-probe inserts gradually the tuning lobes into the slot of the slabline (FIG. 7B and FIG. 11A) creating adjustable capacitive coupling to the center conductor and controlling better the amplitude of the reflection factor GAMMA (FIGS. 5 and 6B) introducing higher tuning resolution at high GAMMA (see FIG. 16, tuning response 160 versus 161); notched (dual-lobe), rotating disc-probes high GAMMA tuning probes is new. There are, though, two fundamental challenges that complicate this implementation compared with single-lobe disc-probes (FIG. 6B), which require structural modifications.

Figure 10:
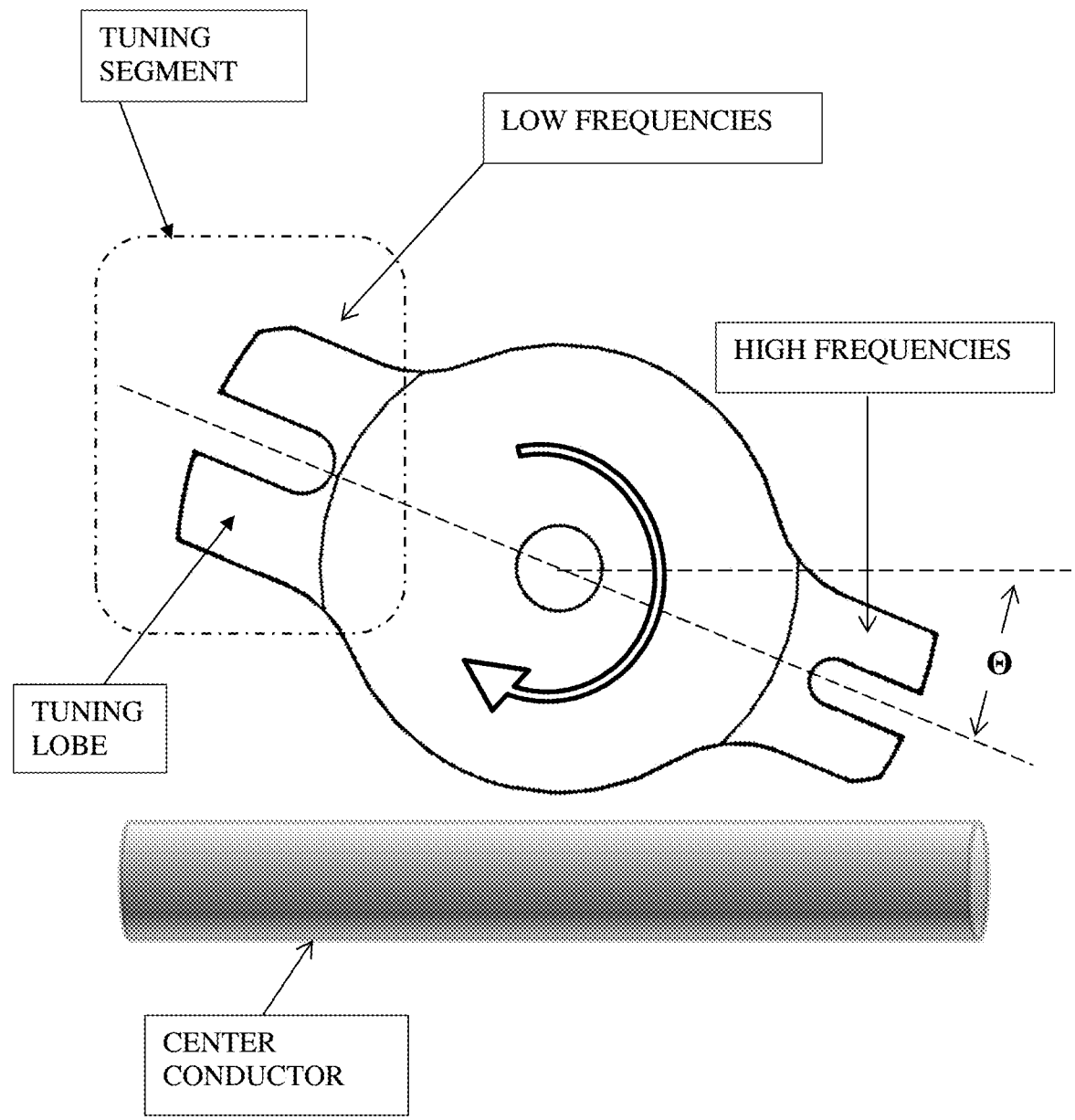
FIG. 10 depicts initialized of dual frequency band notched disc-probe.
Figure 11B:
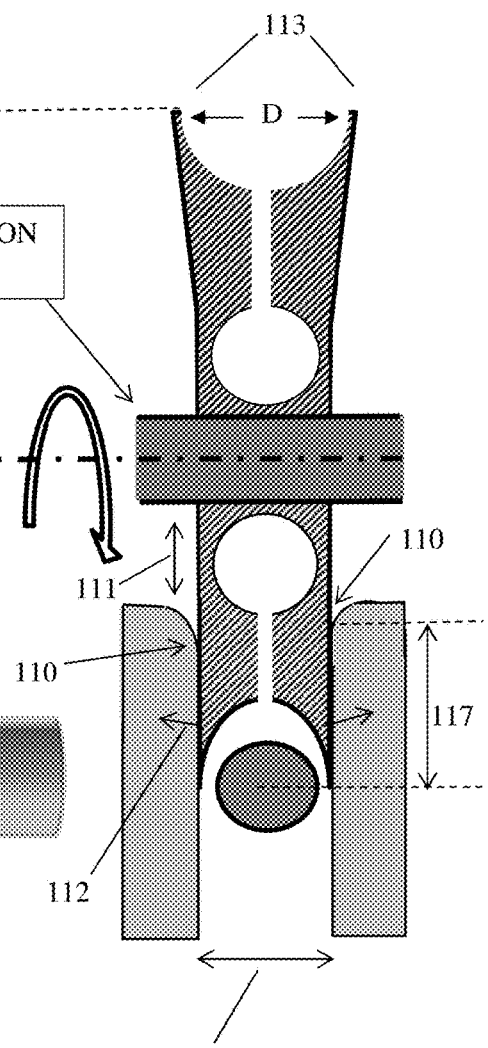
Figure 12:
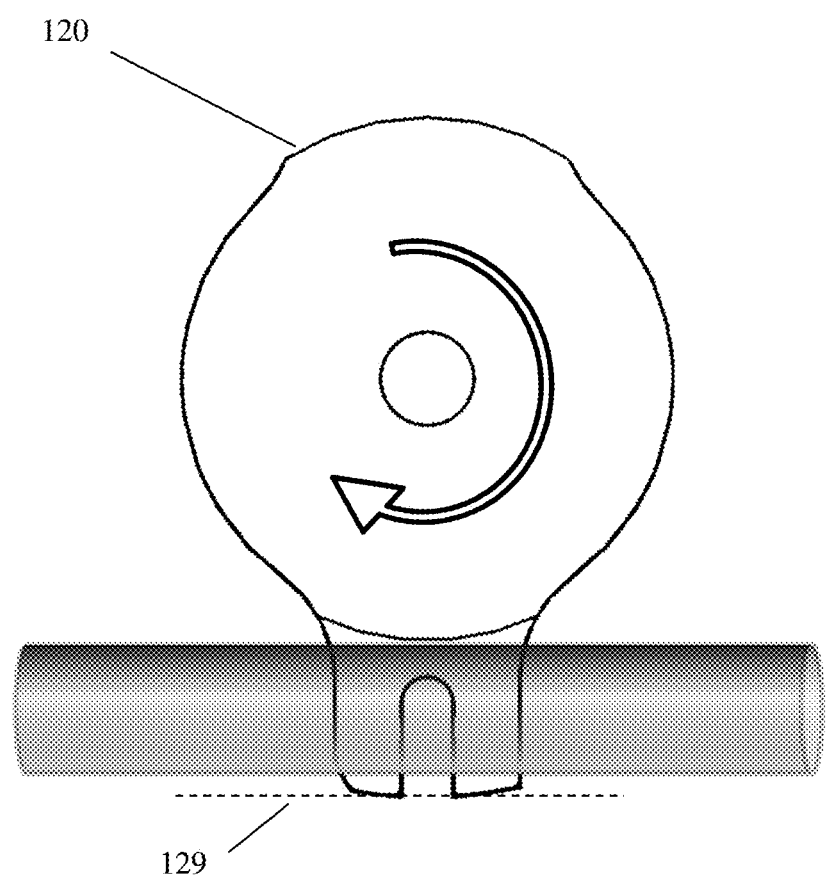
FIG. 12 depicts full coupling (maximum reflection) of high frequency segment of single frequency band notched dual frequency band disc-probe (see also FIG. 13).
Figure 15:
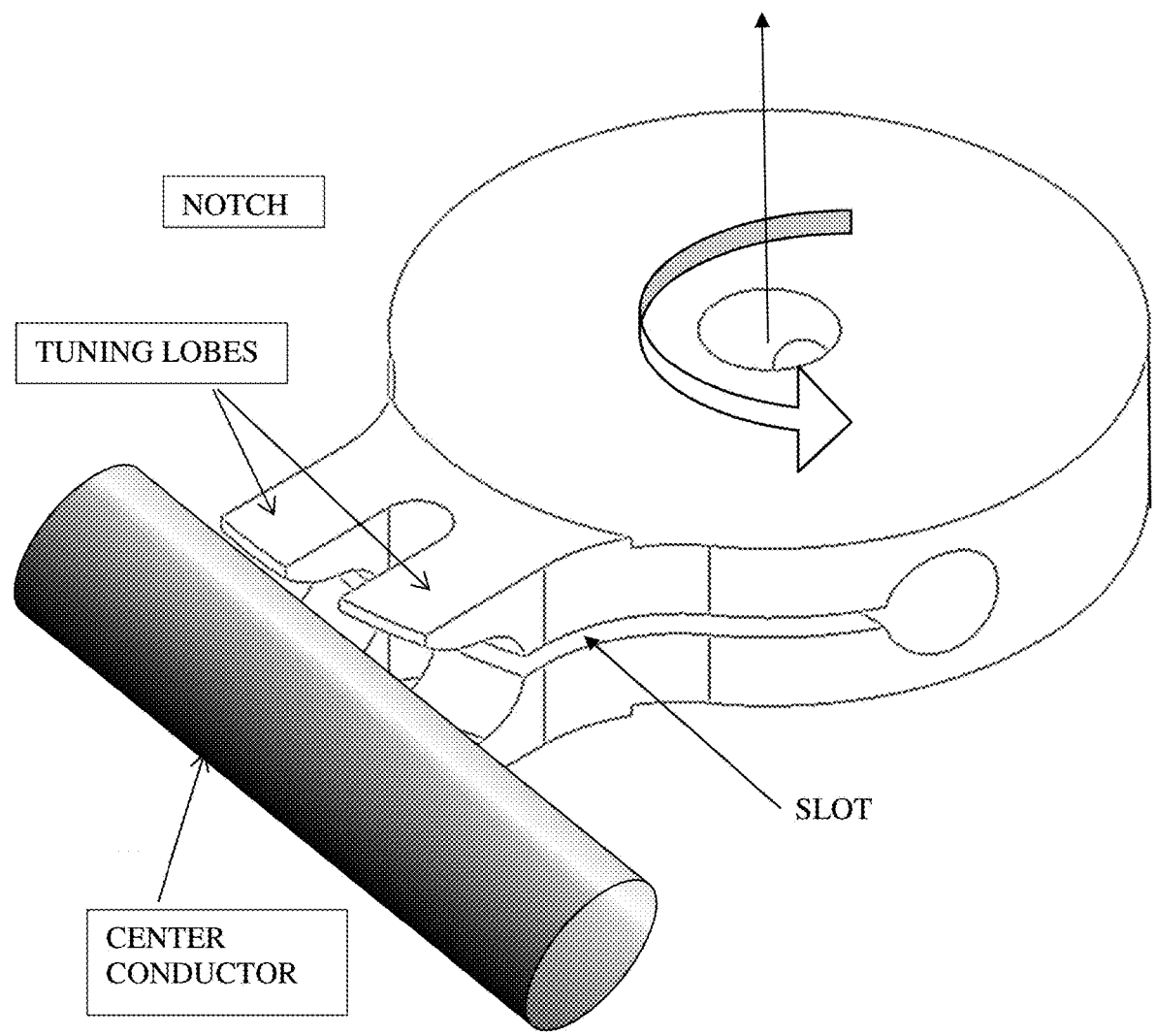
FIG. 15 depicts high GAMMA disc-tuning probe with a single tuning segment (single frequency band) of notched lobes.

Firstly, the tuning parts of the disc-probes cannot be entirely circular, as shown in prior art FIGS. 5 and 6B. If they were, the notch (FIG. 9) would not allow both tuning lobes to be coupled fully (as shown in FIG. 12, by item 129 and in FIG. 15) at the same rotation angle Θ (defined in FIG. 10); the pre-matching effect and high VSWR require full engagement of both lobes and would be reduced. Secondly, starting from the "initialized" position (FIG. 10) at 0°<Θ<30° and going over to partly coupled position (FIG. 11) at Θ≈60° the edges 113 of the un-engaged segment would hit on the top 27 of the top edge of the square walls of the slabline 24, as shown in FIG. 2, and catch on the edge, because the probes are sliced 91 parallel to the disc surface and preloaded to create a springing effect 112 against the sidewalls and ensure perfect sliding RF ground contact; in other words the cubical probes of FIG. 2 cannot be withdrawn higher than the top position in order to avoid full disengagement from the slabline slot, though up to now this has not been necessary, since probe withdrawal of more than 3 center conductor diameters ensures quasi perfect decoupling. This is impossible for disc-probes having two tuning segments, whereby at least one is fully disengaged (FIGS. 7, 9, 10 and 11): in this case, when one tuning lobe disengages, it spreads open 113 and cannot be re-inserted 116 in an unmodified slabline slot, since the opening D, when the lobes 115 are withdrawn 111 from the slot, is bigger than the width 114 of the slot of the slabline. Therefore, in order to eliminate these two problems, that is (a) the impossibility of full coupling of circular probes and (b) the insertion incompatibility, both the disc-probes and the slabline require a different design.

Figure 9:
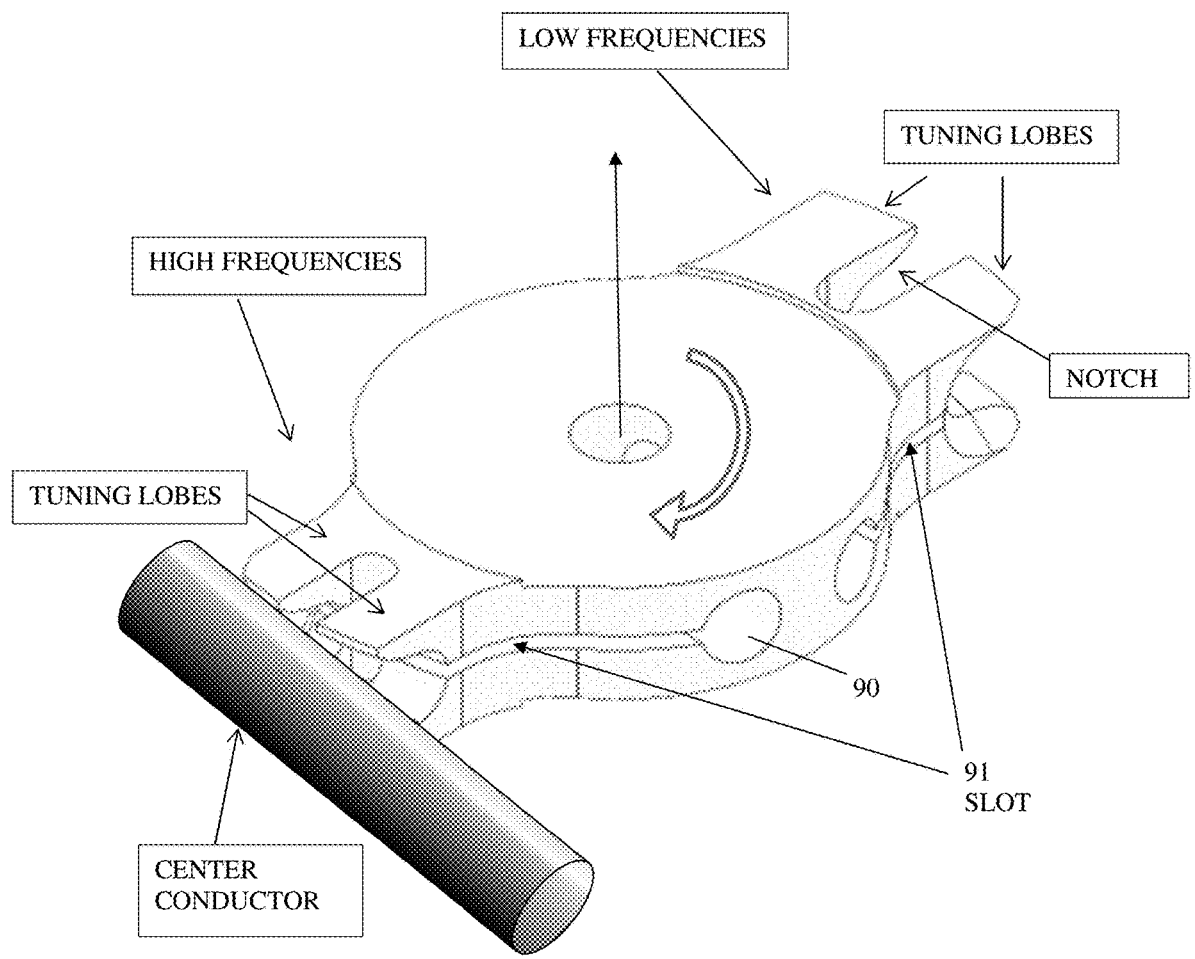
FIG. 9 depicts perspective 3D view of two segment (dual frequency band) notched disc-probe and center conductor.

The new probe design requires the two tuning lobes of each segment, on both sides of the notch to engage fully simultaneously (FIGS. 9 and 12). That is, while the core of the disc-probes remains a circular disc 120 the edge of the tuning lobes must be a straight line 129, ensuring full penetration and maximum coupling.

Figure 13:
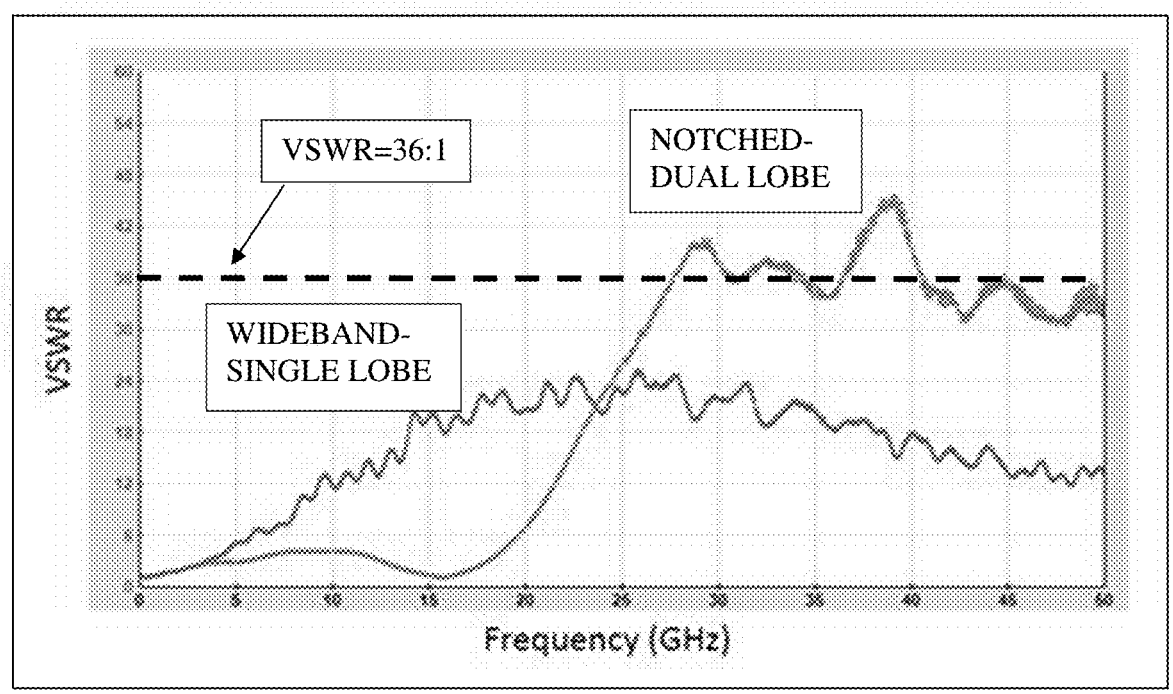
FIG. 13 depicts comparison of VSWR (GAMMA= (VSWR−1)/(VSWR+1)) of wideband versus single frequency band notched disc-probes; example: VSWR=36: 1→GAMMA=0.946.

The invention is disclosed in two basic embodiments: a single frequency band and a dual frequency band. As seen in FIG. 13 the static pre-matching notch structure generates higher GAMMA at reduced frequency bandwidth. A dual notched disc-probe (FIG. 7A through 7D) allows covering two different (adjacent or not) frequency bands. The frequency bands are designed for using the width of the two lobes and the distance to each-other (the notch width).

The slot 91 and the hole 90 cut into both low and high frequency tuning segments ensure springing effect 112 and good RF grounding sliding contact; therefore the inside top corners of the sidewalls of the slabline must also be modified. Smooth chamfering is an effective solution 110. It ensures that, when the tuning lobes rotate into the slot (angle Θ>40°) the lobes will not snag on the corners, but they will be guided smoothly into the slot as shown in FIG. 11. Widening the slot of the slabline does not affect the electric field distribution and the characteristic impedance if the change in channel width starts approximately at least 2.5 times the diameter of the center conductor above the middle of the center conductor itself, shown schematically as item 117. This is because the electric field is concentrated in the narrow gap area between the side of the center conductor and the slabline walls; the electric field above and below the center conductor is low and decreases exponentially with the distance 117 (see also FIG. 2).

The frequency range of the notched disc-probes is optimized numerically using commercially available high frequency simulator software. The exact dimensions are critical at frequencies higher than 20 GHz. Differences of the order of 50 micrometers in mechanical dimensions (notch or lob width) will shift the range considerably. A measured comparison between a notched millimeter-wave disc-probe, and a wideband (not notched) disc-probe is shown in FIG. 13. The wideband probe generates a maximum VSWR of 12:1 over a frequency range of 35 GHz (15 to 50 GHz); the notched probe generates a maximum VSWR of 36:1 over a frequency band of 23 GHz. At lower frequencies the difference is larger where notched probes cover smaller frequency range and generate higher VSWR.

The tuners must be calibrated before they can be used (see ref. 8); that is the scattering (s-) parameters of the tuner two-port must be measured for all intended tuner states (probe angle and horizontal position) and saved, available for later use. Calibration occurs using a pre-calibrated vector network analyzer 80 (VNA) with the tuner connected between its test 86 and idle 89 ports with the test ports of the VNA using high quality RF cables 85; VNA and tuners motors 84 and 87 are controlled by a board 83 using digital cables 88, 81 from the PC 82 and s-parameters of the tuner two-port are measured at a given test frequency F for a multitude of tuning probe positions (motor 87 step angles), selected to cover a large area of the Smith chart, and saved in the matrix format [Sij(M1,M2)], wherein {i,j}={1,2} and M1, M2 are the motor angle positions (steps), since the best choice of electric motors for this application are stepper motors; hereby M1 controls the horizontal position (phase) and M2 the rotation angle of the disc probe (amplitude of GAMMA).

This invention discloses a new family of dual frequency-band, notched disc tuning probes for high frequency slide screw tuners and associated low loss slabline; the two frequency bands are covered by the same probe and are distinct and defined by the shape and size of the notch and the tuning lobes of the probes. The probes rotate to adjustable degree inside the slot of the slabline and control the amplitude of the reflection factor. Obvious alternatives to the proposed disclosure shall not impede on the new concept of dual frequency notched high GAMMA tuning probes.

What I claim as my invention is:

1. Disc-shaped notched tuning probes for slide screw tuners,
comprising
an approximately circular core disc with a protruding notched tuning segment,
wherein
the segment comprises two lobes each having a concave peripheral groove,
and wherein the slide screw tuners comprise,
an input port and an output port and a slabline between the ports, said slabline having two parallel sidewalls and a center conductor, and
at least one remotely controlled mobile carriage sliding parallel to the axis of the slabline,
and wherein
the disc-probe rotates between the sidewalls, controlled by the carriage,
and wherein
the diameter of the groove matches approximately the diameter of the center conductor, the thickness of the lobes matches the width of the slabline channel, and the probe rotates approximately around the center of the core disc.

2. Disc-shaped, dual frequency band, notched tuning probes for slide screw tuners,
comprising
an approximately circular core disc with two protruding notched tuning segments #1
and #2 placed approximately diametrically on the periphery of the core,
wherein
each segment comprises two lobes, each having a concave peripheral groove, and wherein the slide screw tuners comprise,
a slabline between an input port and an output port with a channel between two grounded parallel sidewalls and a center conductor, and
at least one remotely controlled mobile carriage sliding parallel to the axis of the slabline,
and wherein
the disc-probe rotates between the sidewalls, controlled by the carriage, and wherein
the diameter of the groove matches approximately the diameter of the center conductor, the thickness of the lobes matches the width of the slabline channel, and the probe rotates approximately around the center of the core disc.

3. Disc-probes as in claim 1 or 2, wherein the concave surface of the groove is dielectrically coated.

4. Disc-probes as in claim 1 or 2, wherein the lobes are sliced in the middle parallel to the disc surface.

5. Slabline, as in claim 1 or 2,
wherein inside top corners of the sidewalls are chamfered.

6. Disc-probes as in claim 2, wherein the lobes of segment #1 are wider than the lobes of segment #2.

* * * * *